United States Patent
Lu

(10) Patent No.: US 8,418,120 B2
(45) Date of Patent: Apr. 9, 2013

(54) SOLUTIONS FOR NETLIST REDUCTION FOR MULTI-FINGER DEVICES

(75) Inventor: Ning Lu, Essex Junction, VT (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 13/188,129

(22) Filed: Jul. 21, 2011

(65) Prior Publication Data

US 2013/0024828 A1    Jan. 24, 2013

(51) Int. Cl.
  G06F 17/50        (2006.01)
  G06F 9/45         (2006.01)
  G06F 9/455        (2006.01)

(52) U.S. Cl.
  USPC ............... 716/132; 716/102; 716/103

(58) Field of Classification Search ................ None
  See application file for complete search history.

(56) References Cited

U.S. PATENT DOCUMENTS

| | | | |
|---|---|---|---|
| 5,648,920 A | | 7/1997 | Duvvury et al. |
| 5,920,486 A | * | 7/1999 | Beahm et al. ............... 716/102 |
| 5,966,520 A | | 10/1999 | Buer et al. |
| 6,704,911 B2 | | 3/2004 | Yang |
| 6,711,723 B2 | | 3/2004 | Tsai et al. |
| 6,728,942 B2 | | 4/2004 | Lampaert et al. |
| 7,098,755 B2 | | 8/2006 | Zhao et al. |
| 7,139,990 B2 | * | 11/2006 | Singh et al. ............... 716/112 |
| 7,243,317 B2 | * | 7/2007 | Wang et al. ............... 716/112 |
| 7,606,692 B2 | | 10/2009 | Spadari et al. |
| 7,631,281 B2 | | 12/2009 | Kim |
| 2008/0230859 A1 | | 9/2008 | Zaghloul et al. |

OTHER PUBLICATIONS

Amin, et al., "Realizable reduction of interconnect circuits including self and mutual inductances," Computer-Aided Design of Integrated Circuits and Systems, IEEE Transaction, vol. 24, Issue 2, Jan. 24, 2005, Abstract.

Blotti, et al., "Gate recognition and netlist reduction for switch-level simulation of dynamic bit-level systolic arrays," Mixed Signal Design, 2001. SSMSD, 2001 Soutwest Symposium, pp. 56-60, Aug. 7, 2002, Abstract.

Silvant, Mathias, "How do you qualify netlist reduction and circuit extraction?," Jan. 4, 2010, 7 pages.

* cited by examiner

*Primary Examiner* — A. M. Thompson

(74) *Attorney, Agent, or Firm* — Richard M. Kotulak; Hoffman Warnick LLC

(57) ABSTRACT

A computer-implemented method for performing a layout extraction for a multi-fingered semiconductor device is disclosed. The method reduces the netlist for the device and the number of device fingers by identifying a set of device common nodes, and combining a plurality of parasitic elements in the device to form a set of representative parasitic elements which are connected to respective device common nodes. In one embodiment, the method includes combining the parasitic elements of at least one device common node into a single representative parasitic element which is representative of the original parasitic elements.

20 Claims, 14 Drawing Sheets

SOLUTIONS FOR NETLIST REDUCTION FOR MULTI-FINGER DEVICES

BACKGROUND OF THE INVENTION

The subject matter disclosed herein relates to the analysis of integrated circuits, logic gates and/or multi-finger semiconductor devices, such as multi-finger metal-oxide-semiconductor (MOS) transistors, multi-finger MOS capacitors, etc. Specifically, the subject matter disclosed herein relates to solutions for netlist reductions of a multi-finger device.

The design process for a semiconductor device, a logic gate or an integrated circuit may include computer implemented transistor-level circuit layout simulations. These simulations may include a Simulation Program with Integrated Circuit Emphasis (SPICE) netlist which includes the parasitic resistive elements (e.g., diffusion resistance, contact resistances, local wire resistance, etc.), parasitic capacitive elements (capacitive coupling between a transistor's gate and source, capacitive coupling between a transistor's gate and drain, capacitive coupling between a transistor's source and drain, etc.), and parasitic inductive elements, which are inherent in semiconductor devices and circuits. Values (e.g., resistance, capacitance, inductance, etc.) for these parasitic elements may be extracted from a design layout by a parasitic extraction tool and included in the netlist before simulation (e.g. a SPICE simulation) of the design, thereby allowing for the effects of these parasitic elements to be accounted for in the simulation results. However, inclusion of parasitic elements in the netlist may increase the processing time and computation cost associated with the simulation, thereby complicating the design and simulation process. While some netlist elements (e.g., interconnect resistive elements and interconnect capacitive elements) can be reduced using approaches known in the art (e.g., $\Delta$-Y transformation or delta-star transformation, filtering, delay-oriented local operations, mathematical model order reduction, etc.), a netlist for multi-finger devices is difficult to effectively reduce, as it contains a netlisting of multiple MOS transistors (i.e., multiple model calls of MOS transistors).

BRIEF SUMMARY OF THE INVENTION

Solutions for netlist reductions for use in solving of layout optimizations for a multi-finger semiconductor device are disclosed. In one aspect, a computer-implemented method for performing a netlist reduction for a multi-finger device, the method comprising: extracting a netlist for the multi-finger device, wherein each finger in the multi-finger device has a width and the netlist includes a set of parasitic resistive elements, a set of parasitic inductive elements, and a set of parasitic capacitive elements; identifying at least one of a common gate node for the multi-finger device, a common source node for the multi-finger device, a common drain node for the multi-finger device, a common diffusion node for the multi-finger device, or a common substrate node for the multi-finger device; replacing all of the fingers of the multi-finger device with a new device having a total width equivalent to a sum of the widths of the fingers of the multi-finger device; combining parasitic resistive elements at the common source node into a common source resistive element; combining parasitic resistive elements at the common drain node into a common drain resistive element; combining parasitic resistive elements at the common gate node into a common gate resistive element; combining parasitic resistive elements at the common substrate node into a common substrate resistive element; and producing a reduced netlist for the multi-finger device by placing each of the common source resistive element, the common drain resistive element, the common gate resistive element and the common substrate resistive element at a respective common node for the multi-finger device.

A first aspect of the invention provides a computer-implemented method for performing a netlist reduction for a multi-finger device, the method comprising: extracting a netlist for the multi-finger device, wherein each finger in the multi-finger device has a width and the netlist includes a set of parasitic resistive elements, a set of parasitic inductive elements, and a set of parasitic capacitive elements; identifying at least one of a common gate node for the multi-finger device, a common source node for the multi-finger device, a common drain node for the multi-finger device, a common diffusion node for the multi-finger device, or a common substrate node for the multi-finger device; replacing all of the fingers of the multi-finger device with a new device having a total width equivalent to a sum of the widths of the fingers of the multi-finger device; combining parasitic resistive elements at the common source node into a common source resistive element; combining parasitic resistive elements at the common drain node into a common drain resistive element; combining parasitic resistive elements at the common gate node into a common gate resistive element; combining parasitic resistive elements at the common substrate node into a common substrate resistive element; and producing a reduced netlist for the multi-finger device by placing each of the common source resistive element, the common drain resistive element, the common gate resistive element and the common substrate resistive element at a respective common node for the multi-finger device.

A second aspect of the invention provides A computer system comprising: at least one computing device configured to perform a layout extraction for a multi-finger device by performing actions comprising: extracting a netlist for the multi-finger device, wherein each finger in the multi-finger device has a width and the netlist includes a set of parasitic resistive elements, a set of parasitic inductive elements, and a set of parasitic capacitive elements; identifying at least one of a common gate node for the multi-finger device, a common source node for the multi-finger device, a common drain node for the multi-finger device, a common diffusion node for the multi-finger device, or a common substrate node for the multi-finger device; replacing all of the fingers of the multi-finger device with a new device having a total width equivalent to a sum of the widths of the fingers of the multi-finger device; combining parasitic inductive elements at the common source node into a common source inductive element; combining parasitic inductive elements at the common drain node into a common drain inductive element; combining parasitic inductive elements at the common gate node into a common gate inductive element; combining parasitic inductive elements at the common substrate node into a common substrate inductive element; and producing a reduced netlist for the multi-finger device by placing each of the common source inductive element, the common drain inductive element, the common gate inductive element and the common substrate inductive element at a respective common node for the multi-finger device.

A third aspect of the invention provides a computer program comprising program code embodied in at least one computer-readable storage medium, which when executed, enables a computer system to implement a method for performing a layout extraction for a multi-finger device, the method comprising: extracting a netlist for the multi-finger device, wherein each finger in the multi-finger device has a width and the netlist includes a set of parasitic resistive elements, a set of parasitic inductive elements, and a set of parasitic capacitive elements; identifying at least one of a common gate node for the multi-finger device, a common source node for the multi-finger device, a common drain node for the multi-finger device, a common diffusion node for the multi-finger device, or a common substrate node for the multi-finger device; replacing all of the fingers of the multi-finger device with a new device having a total width equivalent to a sum of the widths of the fingers of the multi-finger device; combining parasitic resistive elements at the common source node into a common source resistive element; combining parasitic resistive elements at the common drain node into a common drain resistive element; combining parasitic resistive elements at the common gate node into a common gate resistive element; combining parasitic resistive elements at the common substrate node into a common substrate resistive element; and producing a reduced netlist for the multi-finger device by placing each of the common source resistive element, the common drain resistive element, the common gate resistive element and the common substrate resistive element at a respective common node for the multi-finger device.

A fourth aspect of the invention provides a computer-implemented method for performing a layout extraction for a multi-finger device is disclosed, the method comprising: extracting a detailed netlist for the multi-finger device, wherein the netlist includes $n_f$ separate devices and parasitic elements; identifying at least one of a common gate node, a common source node, a common drain node, a common diffusion node and a common substrate node; combining all of its parasitic resistive elements into a single resistive element; combining all of its parasitic inductive elements into a single inductive element; and combining all of its capacitive elements into a single capacitive element; and replacing the multiple $n_f$ separate devices in the netlist with a single device having an equivalent total width representing the sum of the widths of the multiple fingers.

BRIEF DESCRIPTION OF THE DRAWINGS

These and other features of this invention will be more readily understood from the following detailed description of the various aspects of the invention taken in conjunction with the accompanying drawings that depict various embodiments of the invention.

Figure 1:
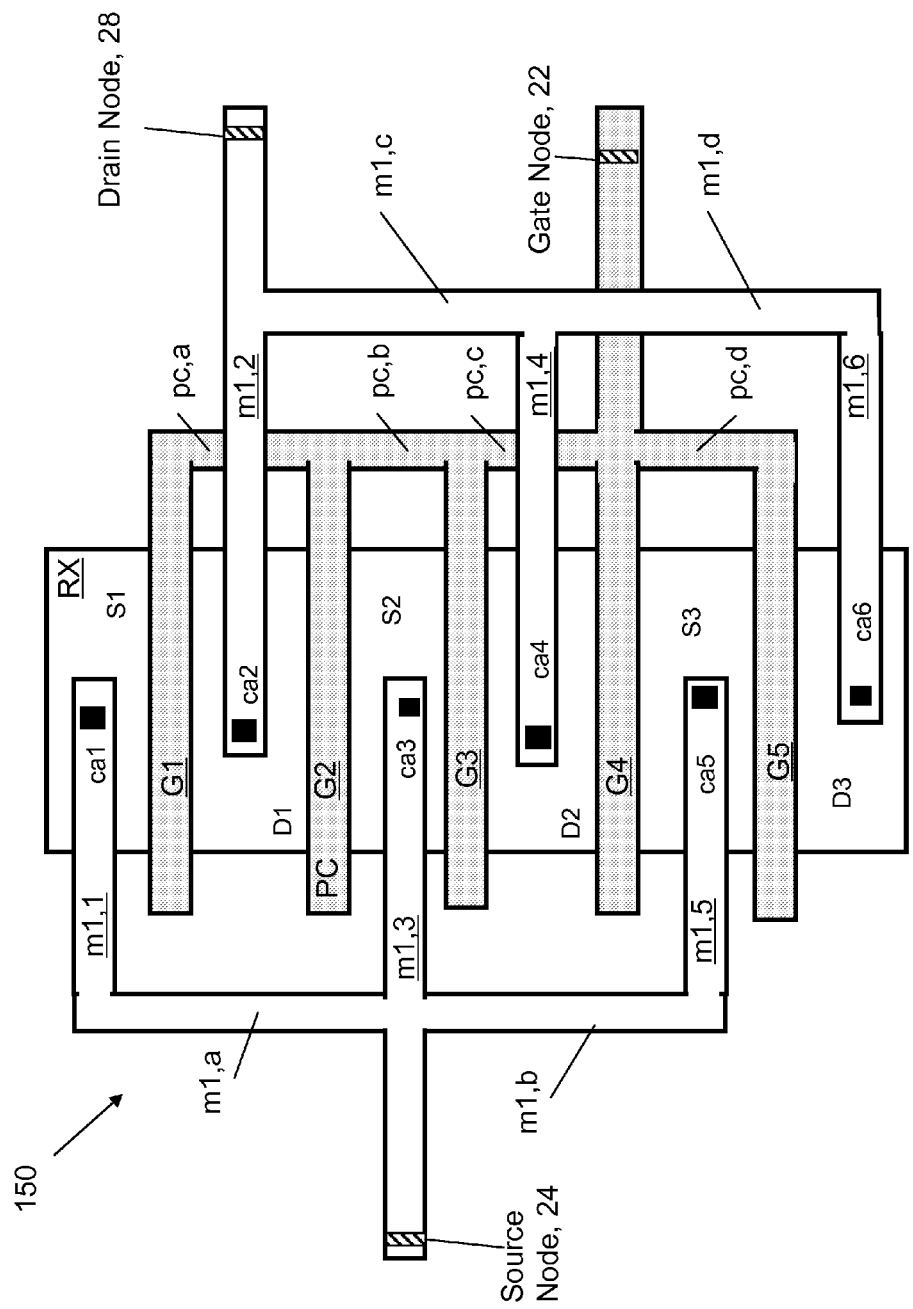
FIG. 1 shows a layout of a multi-finger metal-oxide-semiconductor field effect transistor (MOSFET).

It is noted that the drawings of the invention are not necessarily to scale. The drawings are intended to depict only typical aspects of the invention, and therefore should not be considered as limiting the scope of the invention. In the drawings, like numbering represents like elements between the drawings.

DETAILED DESCRIPTION OF THE INVENTION

The subject matter disclosed herein relates to the analysis of integrated circuits, logic gates and/or multi-finger semiconductor devices, such as multi-finger metal-oxide-semiconductor (MOS) transistors, multi-finger MOS capacitors, etc. Specifically, the subject matter disclosed herein relates to solutions for netlist reduction for multi-finger devices.

In large-scale layout design, prior to producing devices, gates and/or circuits; simulations of the designs of these devices are run to improve the design, satisfy design rules and to optimize performance. These simulations may include the use of a netlist which represents the effects (e.g., resistance, capacitance, inductance, etc.) that various elements and the interconnections between the various elements have on the design/device.

In order to receive accurate simulation results for the design, parasitic elements must be included in the netlist which is to be simulated. These parasitic elements are extracted from the design by a parasitic extraction tool and added to the netlist before the simulation is run. Inclusion of parasitic elements in the netlist enables a more accurate simulation of the design which accounts for the parasitic resistive, capacitive and inductive effects of these elements. However, inclusion of parasitic elements in the netlist can complicate and lengthen the simulation process.

Some design and simulation processes attempt to reduce simulation processing demands by reducing a netlist using methods like Δ-Y transformation, filtering, delay-oriented local operations, mathematical model order reduction, etc. For interconnect resistors and capacitor networks, these methods may simplify the simulation process, balancing simulation speed and accuracy. However, as netlists for multi-finger FETs have multiple device representations, and each FET is not a simple two-terminal device with constant values, reduction using the above-referenced methods may be difficult. The parasitic effects of the elements of a FET may vary depending on the voltage in the respective drain, source, and gate nodes of the FET. As an exact resistance is required to effectively reduce the netlist in the above-referenced design and simulation processes, transistors which have a voltage-dependent variable resistance can complicate these reductions.

In one general aspect of the invention, a method of optimizing an integrated circuit layout for implementation in an integrated circuit includes producing a reduced netlist for the integrated circuit which may be used to simulate device performance. It is understood that as used herein, the terms "layout" or "integrated circuit layout" or "netlist" may refer to a representation of a physical integrated circuit, including e.g., lines, vias, devices, etc. The layouts described herein can be implemented in the manufacture of physical integrated circuits, or components thereof, to form tangible circuitry or devices. As noted herein, aspects of the disclosure provide for analysis and modification of integrated circuit layouts, however, it is understood that these layouts will be used to form tangible devices according to the layout designs.

In reducing the netlist, the invention identifies common nodes (e.g., a common gate node, common source node, common substrate node, common diffusion node, common drain node etc.) for the multi-finger device which may be substituted for the nodes of the original netlist. Further, parasitic elements are identified at each common node and/or between each pair of common nodes in the integrated circuit. Once identified, the parasitic elements of each common node or between each pair of common nodes are combined into a representative parasitic element. Each representative parasitic resistive or inductive element is then connected to a corresponding common node, and each representative parasitic capacitive element is connected between a pair of corresponding common nodes. These representative parasitic elements replace the multiple parasitic elements which were previously located in the netlist, and thereby produce a simplified netlist with a reduced number of parasitic elements. The simplified netlist has a reduced number (from $n_f$ to 1) of device representations (e.g., the number of MOSFETs), a reduced number of parasitic resistive elements, a reduced number of parasitic inductive elements, and a reduced number of parasitic conductive elements. This simplified netlist reduces the circuit simulation time for the multi-finger device.

A first aspect includes a computer-implemented method for performing a layout extraction for a multi-finger device, the method including: extracting a netlist for the multi-finger device, wherein each finger in the multi-finger device has a width and the netlist includes at least one of a set of parasitic resistive elements, a set of parasitic inductive elements, or a set of parasitic capacitive elements; identifying at least one of a common gate node, a common source node, a common drain node, a common diffusion node or a common substrate node; replacing the fingers of the multi-finger device with a new device having a total width equivalent to a sum of the widths of the fingers of the multi-finger device; and combining the parasitic inductive elements of at least one of the common source node, the common drain node, the common gate node, or the common substrate node, into a single inductive element.

It is understood that any values used herein are for illustrative purposes only, and that these values are merely intended to facilitate understanding of the subject matter disclosed. These values should not be considered limiting of the disclosure.

Figure 2A:
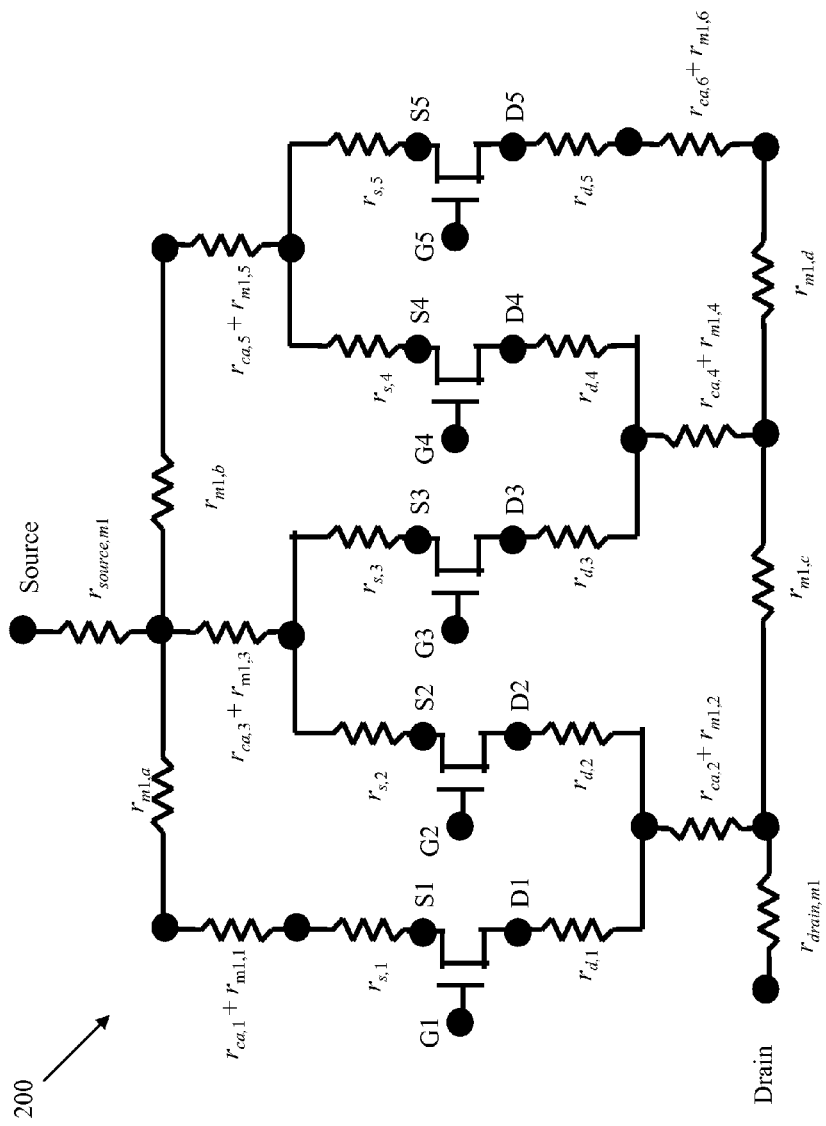
FIG. 2(a) shows an illustrative schematic diagram of the device, source, and drain portions of a netlist for the MOSFET of FIG. 1.
Figure 2B:
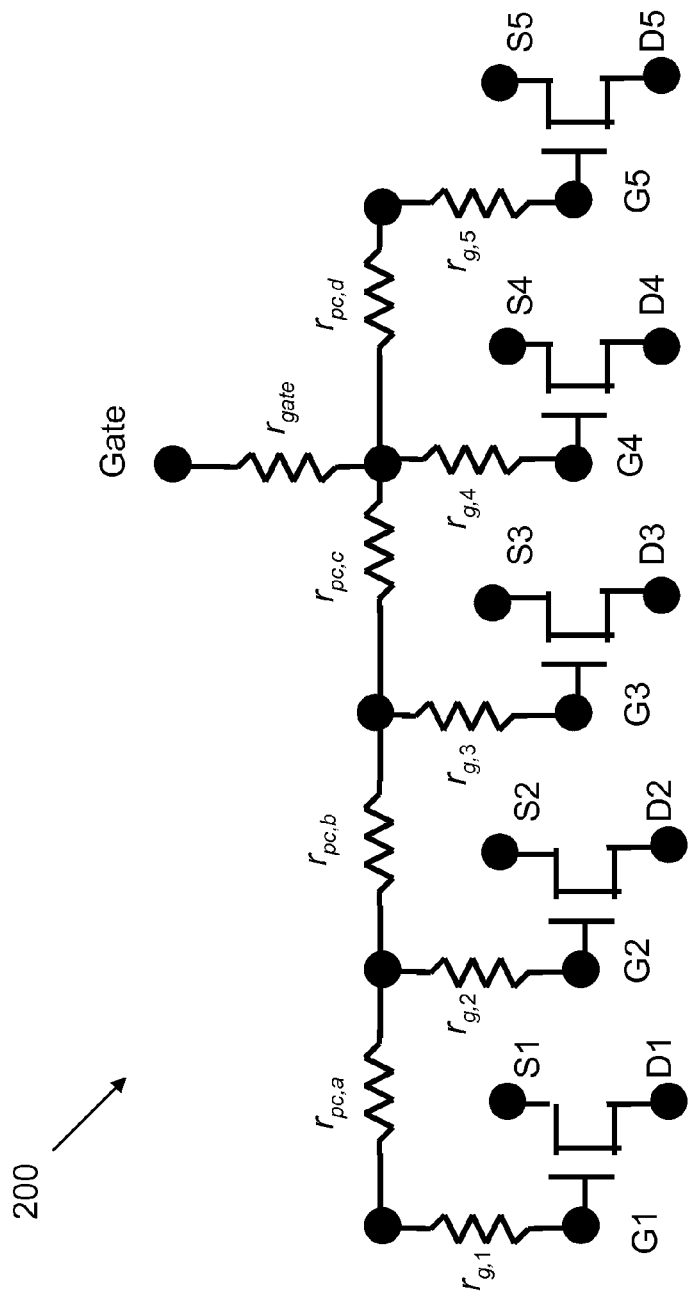
FIG. 2(b) shows an illustrative schematic diagram of the device and gate portions of the netlist for the MOSFET of FIG. 1.

Turning to FIG. 1, an example of a multi-finger (MOSFET) 150 is illustrated. MOSFET 150 includes a common gate node (Gate Node 22); a common source node (Source Node 24); a common drain node (Drain Node 28), and a common substrate node (RX). The gate node comprises fingers G1, G2, G3, G4, and G5; source node, comprises wire segments (source, m1), (m1, 1), (m1, 3), and (m1, 5); and drain node comprises wire segments (drain, m1), (m1, 2), (m1, 4), and (m1, 6). In numbering the fingers of MOSFET 150, the gate node has five fingers; G1, G2, G3, G4, and G5, and thus a number of fingers ($n_f$)=5. The drain node has two inner drain regions ($n_{id}$=2) and one outer drain region ($n_{od}$=1), for an odd $n_f$ for the drain node. The source node has two inner source regions ($n_{is}$=2) and one outer source region ($n_{os}$=1), for an odd $n_f$ for the source node. In operation, current flows through MOSFET 150, from gate fingers G1, G2, G3, G4, and G5 to source node via $1^{st}$ contact (ca1), $2^{nd}$ contact (ca2), $3^{rd}$ contact (ca3), $4^{th}$ contact (ca4), and $5^{th}$ contact (ca5). As the current flows in this manner, each contact may have a parasitic effect on the design. Additionally, as the current flows through the integrated circuit corresponding to the design, parasitic effects are incurred via interconnections and elements, including: $1^{st}$ drain region (D1), $2^{nd}$ drain region (D2), $3^{rd}$ drain region (D3), $1^{st}$ source region (S1), $2^{nd}$ source region (S2), $3^{rd}$ source region (S3), M1 wire segment (m1, a), M1 wire segment (m1, b), M1 wire segment (m1, c), M1 wire segment (m1, d), $1^{st}$ poly segment (pc, a), $2^{nd}$ poly segment (pc, b), $3^{rd}$ poly segment (pc, c), and $4^{th}$ poly segment (pc, d). Generally, a simulation for MOSFET 150 would involve the creation of a netlist for MOSFET 150 including each parasitic element inherent in the design of MOSFET 150. Turning to FIG. 2(a), a schematic diagram of a source portion of a netlist 200 for MOSFET 150 (FIG. 1) is shown with the capacitance elements removed for clarity. Turning to FIG. 2(b), a schematic diagram of a gate portion of a netlist 200 for MOSFET 150 (FIG. 1) is shown with the capacitance elements removed for clarity. A typical simulation run for netlist 200 will consider and compute each element. However, using embodiments of the invention, the netlist may be reduced as multiple MOSFET model calls may be merged into a single MOSFET model 600 shown in FIG. 10.

Figure 3:
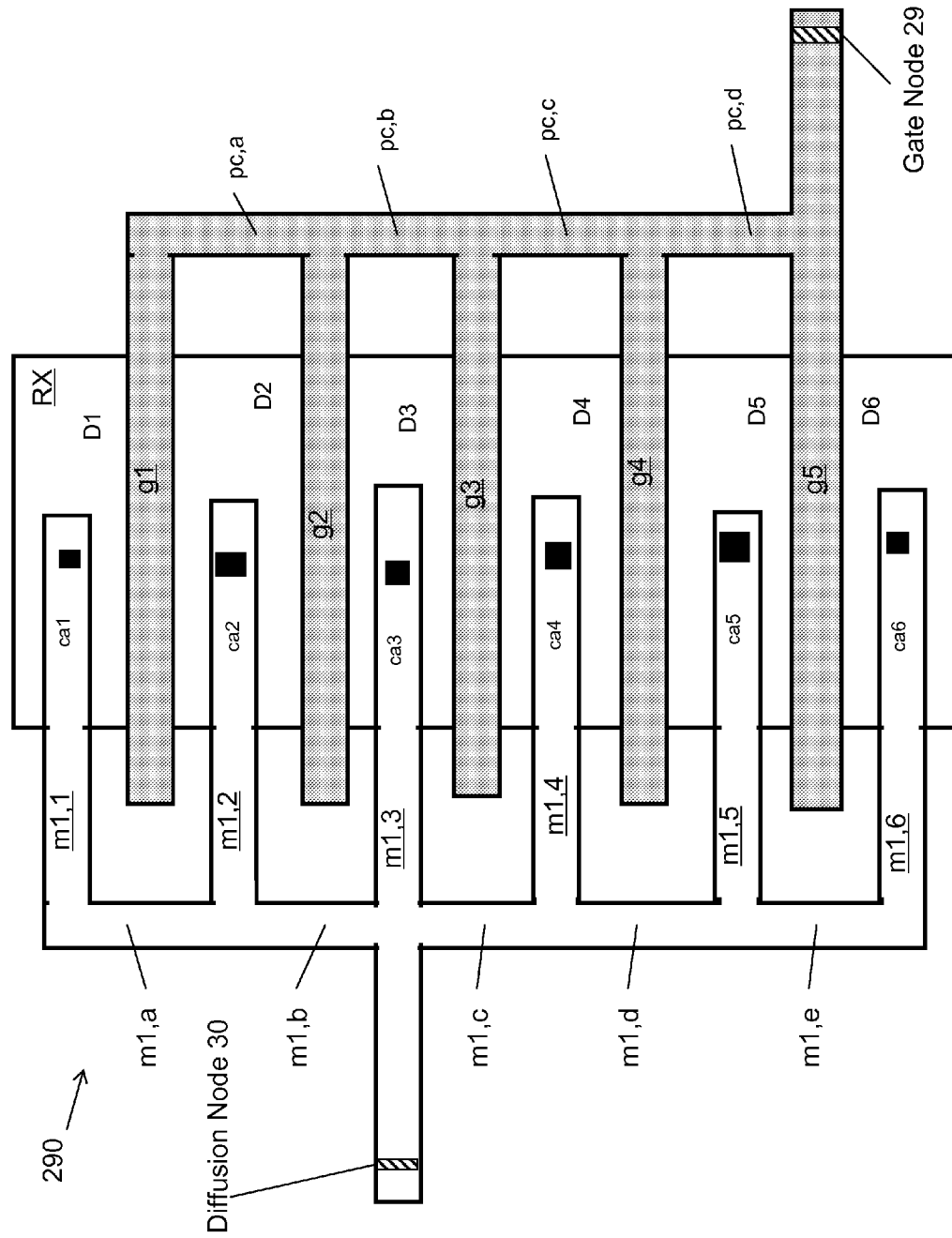
FIG. 3 shows a layout of a multi-finger metal-oxide-semiconductor (MOS) capacitor.
Figure 4:
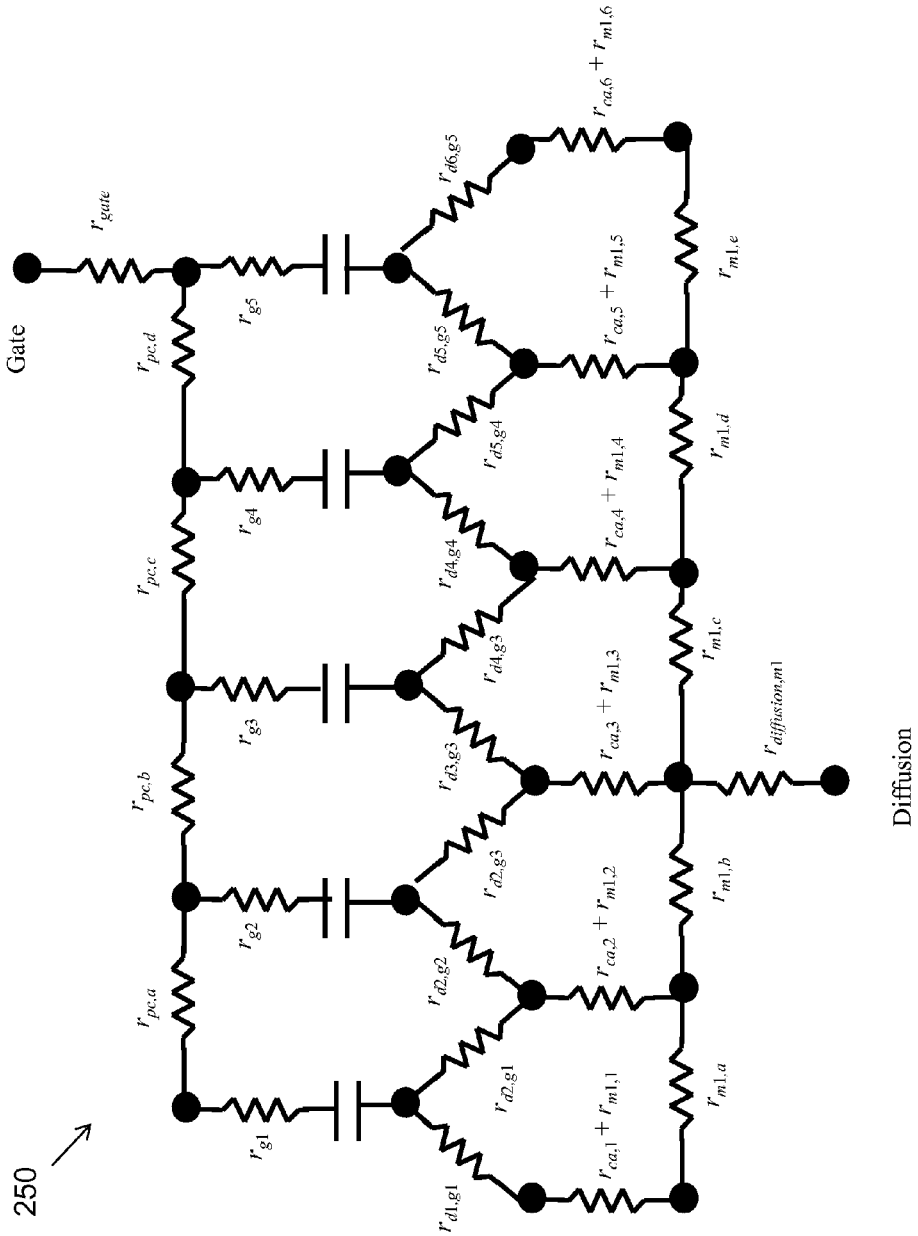
FIG. 4 shows an illustrative schematic diagram of portions of a netlist for the MOS capacitor of FIG. 3.
Figure 11:
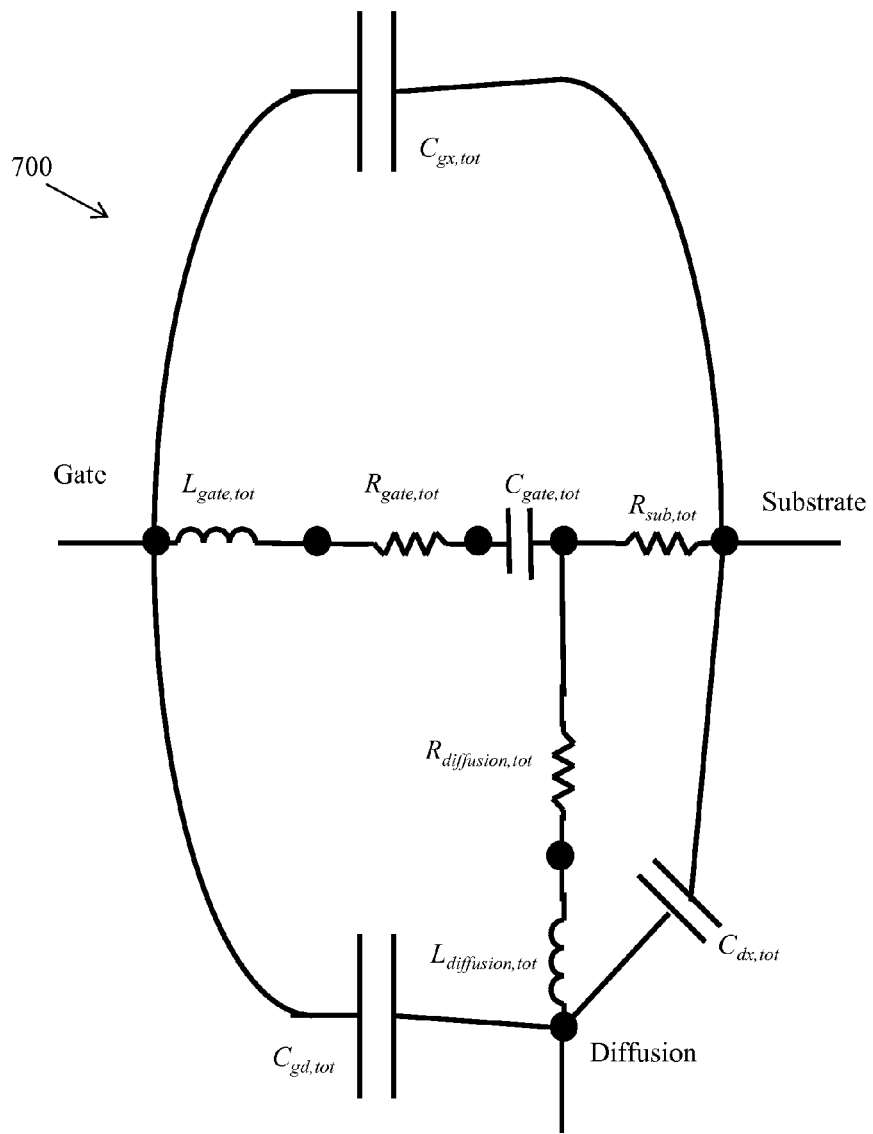
FIG. 11 shows an illustrative schematic diagram of portions of the reduced netlist for the MOS capacitor of FIG. 3.

Turning to FIG. 3 an example of a multi-finger MOS capacitor 290 is illustrated according to embodiments. MOS capacitor 290 includes a common gate node (Gate Node 29) and a common diffusion node (Diffusion Node 30). Where Gate Node 29 comprises fingers G1, G2, G3, G4, and G5; and Diffusion Node 30 comprises m1 wire segments (m1, 1), (m1, 2), (m1, 3), (m1, 4), (m1, 5), and (m1, 6). In numbering the fingers of MOS capacitor 290, Gate has five fingers; G1, G2, G3, G4, and G5 and thus $n_f$=5. Diffusion Node 30 includes 6 diffusion regions. Two of them (m1, 1 and m1, 6) are outer diffusion regions ($n_{od}$=2), and the other four (m1, 2; m1, 3; m1, 4; and m1, 5) are inner diffusion regions ($n_{id}$=4). Current flows through MOS capacitor 290, from Gate fingers G1, G2, G3, G4, and G5 to (diffusion, m1) via contacts, $1^{st}$ contact (ca1), $2^{nd}$ contact (ca2), $3^{rd}$ contact (ca3), $4^{th}$ contact (ca4), $5^{th}$ contact (ca5), and $6^{th}$ contact (ca6) which may each have a parasitic effect on the design. Additionally, as the current flows through the design, parasitic effects are incurred via interconnections and elements including: $1^{st}$ drain region (D1), $2^{nd}$ drain region (D2), $3^{rd}$ drain region (D3), $4^{th}$ drain region (D4), $5^{th}$ drain region (D5), $6^{th}$ drain region (D6), M1 wire segment (m1, a), M1 wire segment (m1, b), M1 wire segment (m1, c), M1 wire segment (m1, d), M1 wire segment (m1, e), $1^{st}$ poly segment (pc, a), $2^{nd}$ poly segment (pc, b), $3^{rd}$ poly segment (pc, c), and $4^{th}$ poly segment (pc, d). Generally, a simulation for MOS capacitor 290 would involve the creation of a netlist for MOS capacitor 290 including each parasitic element inherent in the design of MOS capacitor 290. Turning to FIG. 4, a schematic diagram of a netlist 250 for MOS capacitor 290 (FIG. 3) is shown with the capacitance elements removed for clarity. A typical simulation run for netlist 250 will consider and compute each element. However, using embodiments of the invention, the netlist may be reduced as multiple MOS capacitor model calls may be merged into a single MOS capacitor model 700 shown in FIG. 11.

It is understood that the teachings of this disclosure may be applied to netlists for multi-fingered devices, gates and/or circuits that are not easily reduced using prior approaches (e.g., filtering, delay-oriented local operations, mathematical order reduction, etc.). While illustrative examples of a "Field Effect Transistor" and "Netlist Schematics" are used herein, it is understood that the teachings of this disclosure may be applied to a plurality of designs and devices not explicitly described.

Figure 5:
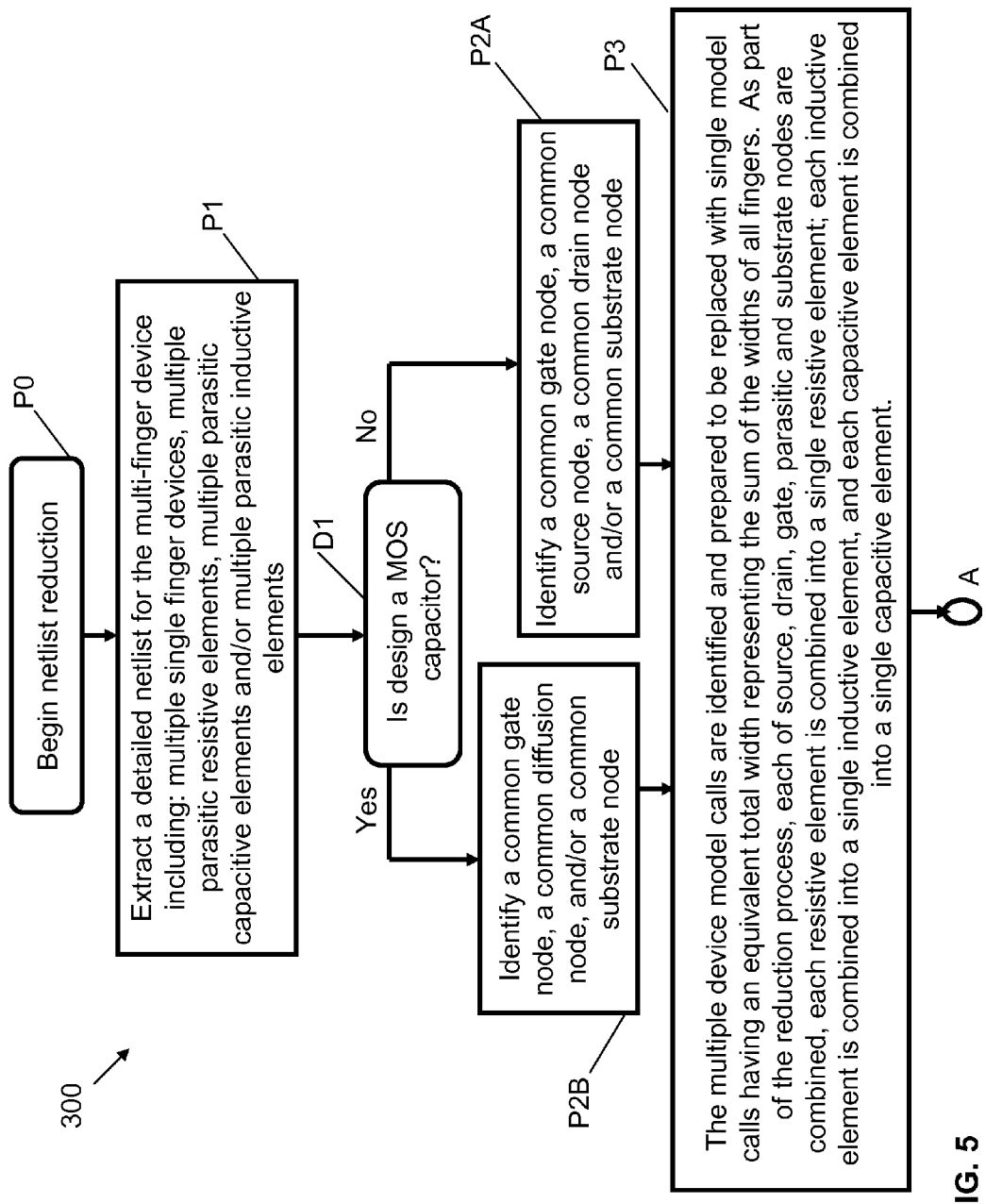
FIG. 5 shows a portion of a process flow diagram illustrating a method according to an embodiment.

Turning to FIG. 5, a method flow diagram illustrating a process 300 according to an aspect of the invention is shown. In one embodiment, the process may include, in preliminary process P0, starting the netlist reduction process. After the netlist reduction process is initiated in P0, at P1, a detailed netlist for the multi-fingered device is extracted. In one embodiment, the extracted netlist may include any of multiple parasitic resistive elements, multiple parasitic capacitive elements and/or multiple parasitic inductive elements. Returning to FIGS. 2(a) and 2(b), with exemplary schematic diagrams of netlist 200 representing multi-finger FET 150 shown in FIG. 1, in FIG. 2(a), netlist 200 shows the source and drain portions of multi-fingered FET 150 as well as the parasitic resistances ($R_{source,m1}$, $R_{m1,a}$, ..., $R_{drain,m1}$) and inductances of the elements which may be contacts, segments of wire, etc. Capacitive elements are not shown in FIG. 2(a) for clarity.

Returning to FIG. 5, following the extraction of netlist 200 at P1, at decision D1, it is determined whether the design is a capacitor or not. If at D1 it is decided that the design is not a capacitor, then at process P2A, at least one of a common gate node, a common drain node and/or a common source node is identified. However, if at D1 it is decided that the design is a capacitor, then at process P2B, a common gate node, a common substrate node, and/or a common diffusion node are identified. Returning to FIG. 2(a), an identified source node (Source) and identified drain node (Drain) are shown on netlist 200. Turning to FIG. 2(b), an exemplary schematic diagram of a netlist 200 is shown with an identified gate node (Gate). Returning to FIG. 5, following node identification at P2A and/or P2B, at process P3, the multiple instances of each device and/or effect in a netlist for a multi-finger device are identified and prepared to be reduced into a single instance. The reduction process will find the total source resistance, the total drain resistance, the total gate resistance, the total substrate resistance, the total source inductance, the total drain inductance, the total gate inductance, the total substrate inductance, the total gate-drain capacitance, the total gate-source capacitance, the total source-drain capacitance, the total drain-substrate capacitance, the total gate-substrate capacitance, and the total source-substrate capacitance.

In the reduction process, the total source, drain, and/or gate resistance is a sum of the resistance contribution from each of the source, drain and/or gate resistive elements. The resistance contribution from each source, drain, and/or gate resistive element to the total source, drain, and/or gate resistance is the product of its resistance and the square of the relative electric current passing through it. Specifically, the total source, drain, and/or gate resistance is obtained by using the below equation (1):

$$R_{node,tot} = \sum_k \left(\frac{I_{node,k}}{I_{node,tot}}\right)^2 R_{node,k}, \quad (1)$$

where node may be the source, drain, diffusion, gate, and/or substrate nodes, $I_{node,tot}$ is the total electric current passing through the node, $I_{node,k}$ is the electric current passing through the given resistive element $R_{node,k}$, and the ratio $I_{node,k}/I_{node,tot}$ is a fraction of the electric current which passes through resistive element $R_{node,k}$. Note that the sum of all $I_{node,k}$ can be either larger than or equal to $I_{node,tot}$, as shown in the below equation (2a):

$$\sum_k I_{node,k} \geq I_{node,tot}. \quad (2a)$$

Among all resistive elements belonging to a common node, when there are at least two resistive elements connected in series, the sum of all $I_{node,k}$ is larger than $I_{node,tot}$, as shown in the below equation (2b):

$$\sum_k I_{node,k} > I_{node,tot}. \quad (2b)$$

Further, in the reduction process, the total source, drain, and/or gate inductance is a sum of the inductance contribution from each of the source, drain, and/or gate inductive elements. The inductance contribution from each source, drain, and/or gate inductive element to the total source, drain, and/or gate inductance is the product of its inductance and the square of the relative electric current passing through it. The total source, drain, and/or gate inductance is obtained by using the below equation (3):

$$L_{node,tot} = \sum_j \left(\frac{I_{node,j}}{I_{node,tot}}\right)^2 L_{node,j}, \quad (3)$$

where node is one of source, drain, diffusion, gate, and substrate nodes, $I_{node,tot}$ is the total electric current passing through the node, $I_{node,j}$ is the electric current passing through inductive element $L_{node,j}$, and the ratio $I_{node,j}/I_{node,tot}$ is the fraction of the electric current which passes through inductive element $L_{node,j}$.

In the reduction process, the total capacitance between any pair of nodes among gate, source, drain, and substrate for a MOS FET, or between any pair of nodes among gate, diffusion, and substrate for a MOS capacitor, is the sum of the individual capacitance elements between that pair of nodes. This is calculated by the below equation (4):

$$C_{node1-node2,tot} = \sum_k C_{node1-node2,k}. \quad (4)$$

Figure 6:
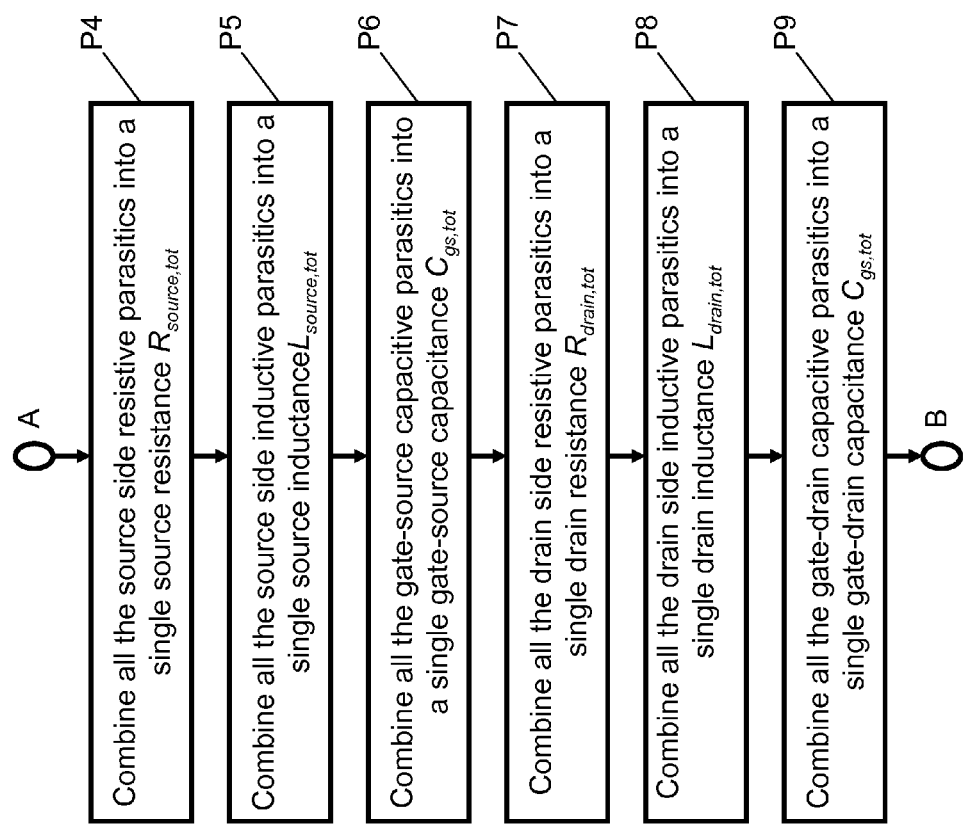
FIG. 6 shows a portion of a process flow diagram illustrating a method according to an embodiment.
Figure 8A:
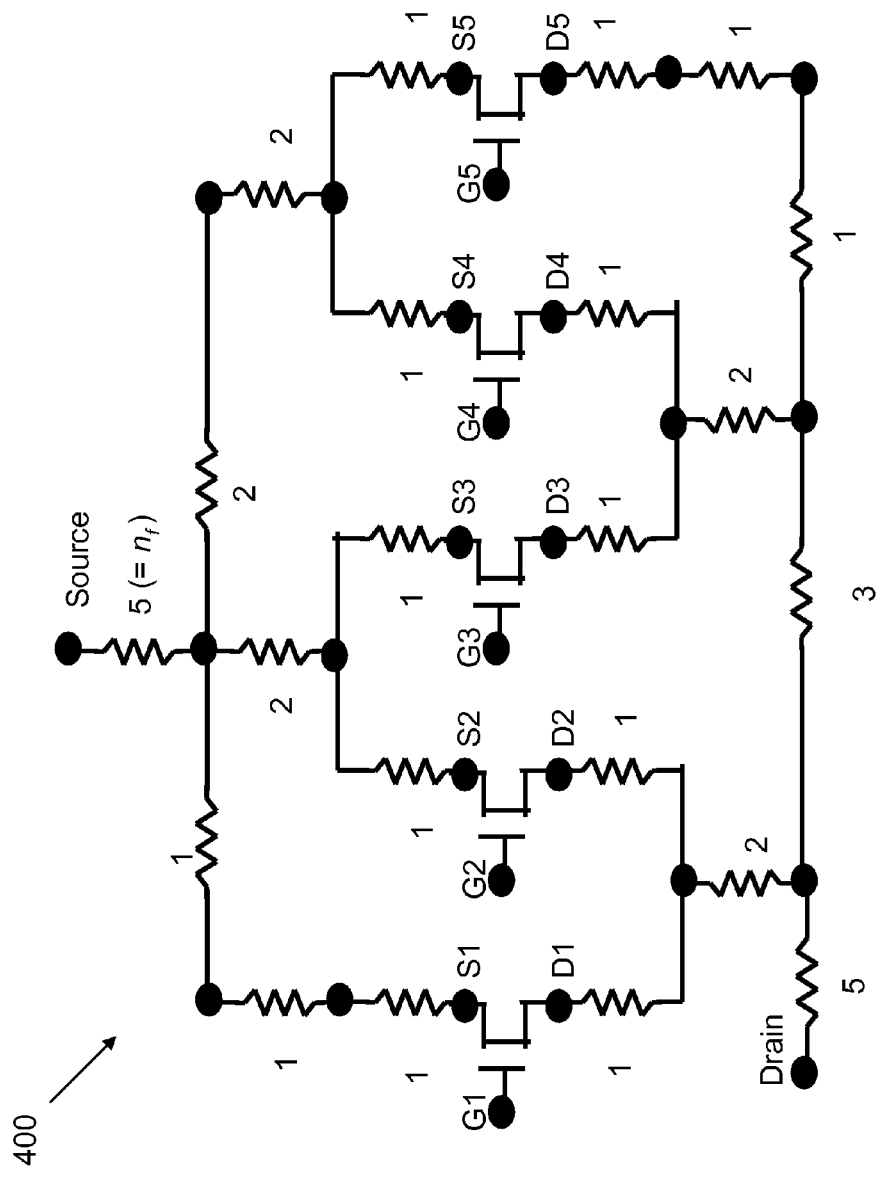
FIG. 8(a) shows the values of weighting factors $n_{s,k}$ and $n_{d,k}$ associated with each of the source node and drain-node parasitic resistive elements in the netlist shown in FIG. 2(a).
Figure 10:
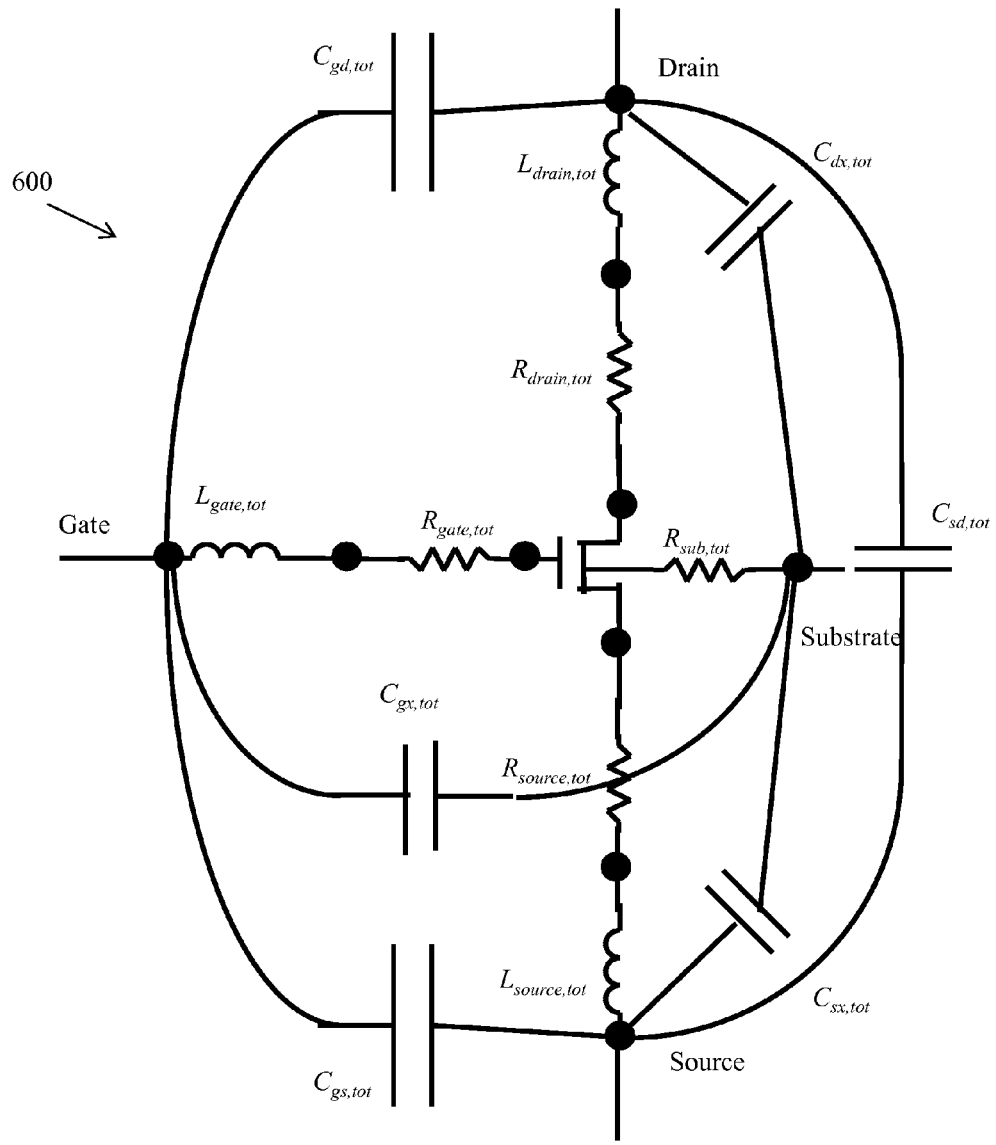
FIG. 10 shows an illustrative schematic diagram of portions of the reduced netlist for the MOSFET of FIG. 1.

Turning to FIG. 6, following P3, at process P4, the resistive source side parasitics are combined into a single source resistance $R_{source,tot}$. An exemplary schematic diagram of a simplified netlist 600 including $R_{source,tot}$, $R_{gate,tot}$, and $R_{drain,tot}$ is shown in FIG. 10 with parasitic elements summed into representative elements, where simplified netlist 600 represents netlist 200 of FIGS. 2(a) and 2(b). Returning to FIG. 6, at process P4, all resistive elements between the common source node and each source node of multiple single-finger FETs are combined into a single resistive element $R_{source,tot}$. The contribution to the total source resistance $R_{source,tot}$ from the kth source-side resistive element is the product of its resistance value $R_{s,k}$ and the square of relative electric current ($I_{s,k}/I_{s,tot}$) passing through it. Total source resistance, $R_{source,tot}$, shown in FIG. 10 may be calculated by applying equation (1) to the source side. This results in equations (5) and (6) below:

$$R_{source,tot} = \sum_k \left(\frac{I_{s,k}}{I_{s,tot}}\right)^2 R_{s,k} = \sum_k \left(\frac{W_{s,k}}{W}\right)^2 R_{s,k}, \quad (5)$$

$$R_{resource,tot} = \sum_k \left(\frac{n_{s,k}}{n_f}\right)^2 R_{s,k}, \quad (6)$$

when all fingers have the same width, where $$W = \sum_{n=1}^{n_f} w_n \quad (7)$$

where 'W' is the total device width or the sum of the width of each of the individual devices width, $I_{s,tot}$ represents the source current and is proportional to the number of fingers, $I_{s,k}$ represents the current passing through a particular element, $R_{s,k}$ represents the individual resistance of the particular element, $n_f$ represents the number of fingers, $W_{s,k}$ is the sum of widths for those device with an electric current which passes through element $R_{s,k}$. Further, $n_{s,k}$ represents the number of fingers which pass an electric current through element $R_{s,k}$. An exemplary schematic diagram 400 of netlist 200 is shown in FIG. 8(a) with $n_{s,k}$ numbering shown for each source side parasitic resistive element. Note that the sum of all $W_{node,k}$ can be either larger than or equal to the total device width W, as shown in the below equation (8a):

$$\sum_k W_{node,k} \geq W. \quad (8a)$$

Among all resistive elements belonging to a common node, when there are at least two resistive elements connected in series, the sum of all $W_{node,k}$ is larger than W, as shown in the below equation (8b), $$\sum_k W_{node,k} > W. \quad (8b)$$

Returning to FIG. 6, following P4, at process P5, the inductive elements between the common source node and each source node of the multiple single-finger FETs are combined into a single inductive element $L_{source,tot}$. The contribution to the total source inductance $L_{source,tot}$ from the kth source-side inductive element is the product of its inductance value $L_{s,k}$ and the square of the relative electric current $(I_{s,k}/I_{s,tot})$ passing through it. Total source inductance, $L_{source,tot}$, shown in FIG. 10 may be calculated by applying equation (3) to the source side. This results in equations (9a) and (9b) below:

$$L_{source,tot} = \sum_k \left(\frac{I_{s,k}}{I_{s,tot}}\right)^2 L_{s,k} = \sum_k \left(\frac{W_{s,k}}{W}\right)^2 L_{s,k}. \quad (9a)$$

$$L_{source,tot} = \sum_k \left(\frac{n_{s,k}}{n_f}\right)^2 L_{s,k}, \quad (9b)$$

when all fingers have the same width.

Following P5, at process P6, the capacitive elements between gate and source nodes of multiple single-finger FETs are combined into a single gate-source capacitive element $C_{gs,tot}$. Application of equation (4) to the gate-source capacitance leads to the below equation (10):

$$C_{gs,tot} = \sum_k C_{gs,k}. \quad (10)$$

Following P6, at process P7, the resistive drain side parasitics are combined into a single drain resistance. An exemplary schematic diagram of a simplified netlist 600 including $R_{source,tot}$, $R_{gate,tot}$, and $R_{drain,tot}$ is shown in FIG. 10. In creating simplified netlist 600, total drain resistance, $R_{drain,tot}$, shown in FIG. 10 may be calculated by applying equation (1) to the drain side. This results in equations (11) and (12) below:

$$R_{drain,tot} = \sum_k \left(\frac{I_{d,k}}{I_{d,tot}}\right)^2 R_{d,k} = \sum_k \left(\frac{W_{d,k}}{W}\right)^2 R_{d,k}, \quad (11)$$

$$R_{drain,tot} = \sum_k \left(\frac{n_{d,k}}{n_f}\right)^2 R_{d,k}, \quad (12)$$

when all fingers have the same width, where $I_{d,tot}$ represents the drain current, $I_{d,k}$ represents the current passing through the kth drain-side resistive element, $R_{d,k}$ represents the individual resistance of the kth drain-side resistive element, $W_{d,k}$ represents the sum of widths for those device which pass an electric current through element $R_{d,k}$, $n_f$ represents the number of fingers, and $n_{d,k}$ represents the number of fingers which pass a current through element $R_{d,k}$. An exemplary schematic diagram of netlist 200 is shown in FIG. 8(a) with $n_{d,k}$ numbering for each parasitic resistive element.

Returning to FIG. 6, following P7, at process P8, the inductive elements between the common drain node and each drain node of multiple single-finger FETs are combined into a single inductive element $L_{drain,tot}$. The contribution to the total drain inductance $L_{drain,tot}$ from the kth drain-side inductive element is the product of its inductance value $L_{d,k}$ and the square of the relative electric current $(I_{d,k}/I_{d,tot})$ passing through it. Total drain inductance, $L_{drain,tot}$, shown in FIG. 10 may be calculated by applying equation (3) to the drain side. This results in the below equations (13) and (14):

$$L_{drain,tot} = \sum_k \left(\frac{I_{d,k}}{I_{d,tot}}\right)^2 L_{d,k} = \sum_k \left(\frac{W_{d,k}}{W}\right)^2 L_{d,k}, \quad (13)$$

$$L_{drain,tot} = \sum_k \left(\frac{n_{d,k}}{n_f}\right)^2 L_{d,k}, \quad (14)$$

when all fingers have the same width.

Following P8, at process P9, the capacitive elements between gate and drain nodes of multiple single-finger FETs are combined into a single gate-drain capacitive element $C_{gd,tot}$. Application of equation (4) to the gate-drain capacitance gives the below equation (15a):

$$C_{gd,tot} = \sum_k C_{gd,k}. \tag{15a}$$

Following P9, at process P10, all capacitive elements between source and drain nodes of multiple single-finger FETs are combined into a single source-drain capacitive element $C_{sd,tot}$. Applying equation (4) to the source-drain capacitance yields the below equation (15b):

$$C_{sd,tot} = \sum_k C_{sd,k}. \tag{15b}$$

Where applying equation (4) to the drain-substrate capacitance leads to equation (15c):

$$C_{dx,tot} = \sum_k C_{dx,k}. \tag{15c}$$

Figure 7:
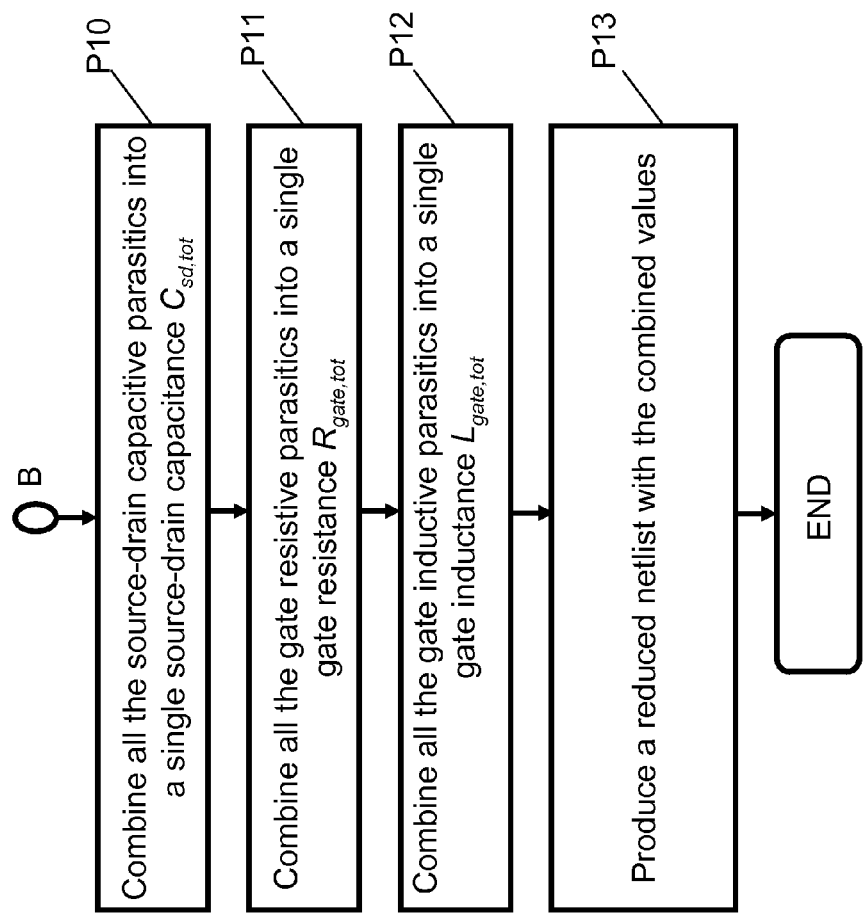
FIG. 7 shows a portion of a process flow diagram illustrating a method according to an embodiment.
Figure 8B:
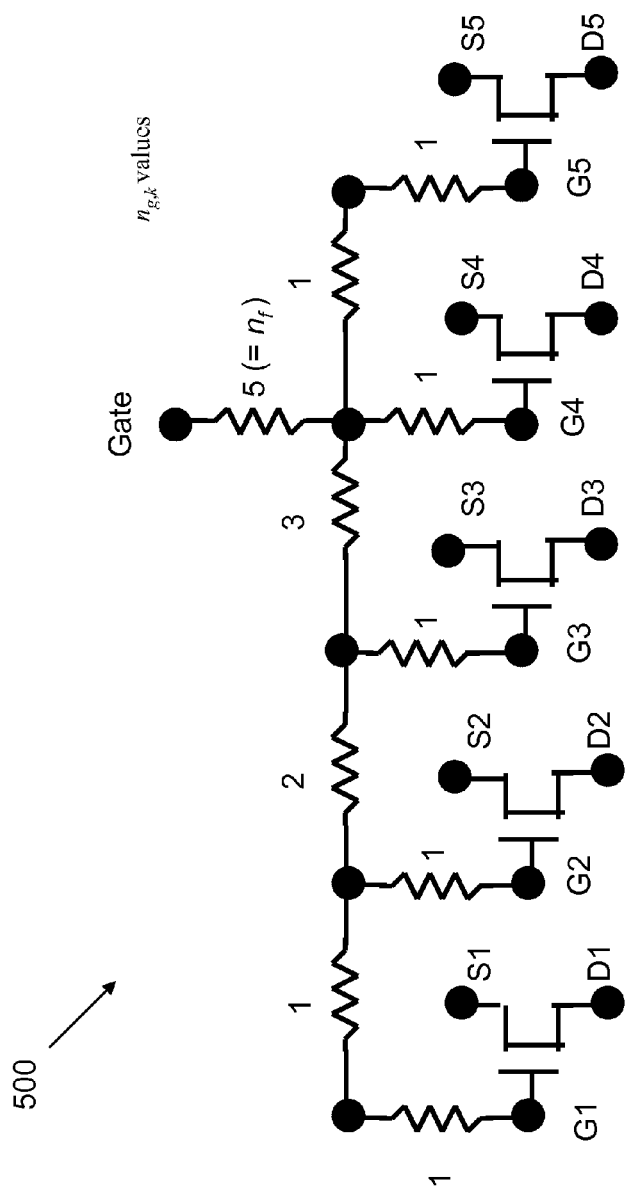
FIG. 8(b) shows the values of weighting factors $n_{g,k}$ associated with each of the gate-node parasitic resistive elements in the netlist shown in FIG. 2(b).

Turning to FIG. 7, following P10, at P11, the resistive elements between the common gate node and each gate node of multiple single-finger FETs are combined into a single resistive element $R_{gate,tot}$. The contribution to the total gate resistance $R_{gate,tot}$ from the kth gate-side resistive element is the product of its resistance value $R_{g,k}$ and the square of the relative electric current $(I_{g,k}/I_{g,tot})$ passing through it. An exemplary schematic diagram of a simplified netlist 600 including $R_{source,tot}$, $R_{gate,tot}$, and $R_{drain,tot}$ is shown in FIG. 10. Single gate resistance, $R_{gate,tot}$, shown in FIG. 10 may be calculated by applying equation (1) to the gate side. This results in the below equations (16a) and (16b):

$$R_{gate,tot} = \sum_k \left(\frac{I_{g,k}}{I_{g,tot}}\right)^2 R_{g,k} = \sum_k \left(\frac{W_{g,k}}{W}\right)^2 R_{g,k}, \tag{16a}$$

$$R_{gate,tot} = \sum_k \left(\frac{n_{g,k}}{n_f}\right)^2 R_{g,k}, \tag{16b}$$

when all fingers have the same width, where $I_{g,tot}$ represents the gate current, $I_{g,k}$ represents the current passing through the kth gate-side resistive element, $R_{g,k}$ represents the individual resistance of the kth gate-side resistive element, $W_{g,k}$ represents the sum of the widths of those devices which pass an electric current through element $R_{g,k}$, $n_f$ represents the number of fingers, and $n_{g,k}$ represents the number of fingers which pass a current through the particular element. An exemplary schematic diagram of netlist 500 is shown in FIG. 8(b) with $n_{g,k}$ numbering for each parasitic inductive element. Returning to FIG. 7, following P11, at process P12, all inductive elements between the common gate node and each gate node of multiple single-finger FETs are combined into a single inductive element $L_{gate,tot}$. The contribution to the total gate inductance $L_{gate,tot}$ from the kth gate-side inductive element is the product of its inductance value $L_{g,k}$ and the square of the relative electric current $(I_{g,k}/I_{g,tot})$ passing through it. Total gate inductance, $L_{gate,tot}$, shown in FIG. 10 may be calculated by applying equation (3) to the gate side. This results in the below equations (17a) and 17(b):

$$L_{gate,tot} = \sum_k \left(\frac{I_{g,k}}{I_{g,tot}}\right)^2 L_{g,k} = \sum_k \left(\frac{W_{g,k}}{W}\right)^2 L_{g,k}, \tag{17a}$$

$$L_{gate,tot} = \sum_k \left(\frac{n_{g,k}}{n_f}\right)^2 L_{g,k}, \tag{17b}$$

when all fingers have the same width.

Returning to FIG. 7, following P12, at P13, a simplified/reduced netlist is produced using the combined values. Following P13, netlist reduction is ended.

Turning to FIG. 10, simplified/reduced netlist 600 for FET 150 may include $R_{source,tot}$, $R_{gate,tot}$, and $R_{drain,tot}$, where these values for FET 150 may be calculated via equations (18), (19), and (20) below:

$$R_{drain,tot} = r_{drain,m1} + \frac{1}{n_f^2}\sum_{l=c,d} n_{m1,l}^2 r_{m1,l} + \tag{18}$$

$$\frac{1}{n_f^2}\left[n_{od} \cdot 1^2 \cdot (r_{ca,n_f+1} + r_{m1,n_f+1}) + \sum_{k=1}^{n_{id}} 2^2(r_{ca,2k} + r_{m1,2k})\right] +$$

$$\frac{1}{n_f^2}\sum_{k=1}^{n_f} r_{d,k},$$

where "2" may be substituted for $n_{id}$ and "1" may be substituted for $n_{od}$ as shown and discussed above.

$$R_{source,tot} = r_{source,m1} + \frac{1}{n_f^2}\sum_{l=a,b} n_{m1,l}^2 r_{m1,l} + \tag{19}$$

$$\frac{1}{n_f^2}\left[n_{os} \cdot 1^2 \cdot (r_{ca,1} + r_{m1,1}) + \sum_{k=1}^{n_{is}} 2^2(r_{ca,2k+1} + r_{m1,2k+1})\right] +$$

$$\frac{1}{n_f^2}\sum_{k=1}^{n_f} r_{s,k},$$

where "2" may be substituted for $n_{is}$ and "1" may be substituted for $n_{os}$ as shown and discussed above.

$$R_{gate,tot} = r_{gate} + \frac{1}{n_f^2}\sum_{l=a,b,c,d} n_{pc,l}^2 r_{pc,l} + \frac{1}{n_f^2}\sum_{k=1}^{n_f} r_{g,k} \tag{20}$$

$$= r_{gate} + \frac{1}{n_f^2}(1^2 r_{pc,a} + 2^2 r_{pc,b} + 3^2 r_{pc,c} + 1^2 r_{pc,d}) + \frac{1}{n_f}r_{g,1}.$$

As can be seen in equation (20), "1", "2" and "3" have been substituted for respective values of $n_{pc,l}$ as shown in simplified netlist 500 of FIG. 8(b). This simplification of equation (20) is accomplished by using the below equation (21):

$$r_{g,1} = r_{g,2} \dots = r_{g,n_f} \tag{21}$$

Netlist reduction for the five finger MOS capacitor 290 (shown in FIGS. 3, 4 and 11), may include use of equations (22) and (23) below:

$$R_{diffusion,tot} = r_{diffusion,m1} + \frac{1}{n_f^2}\sum_{l=a}^{e} n_{m1,l}^2 r_{m1,l} + \frac{1}{n_f^2}\sum_{k=1}^{n_f} n_{d,k;g,k}^2 r_{d,k;g,k} + \quad (22)$$

$$\frac{1}{n_f^2}\sum_{k=1}^{n_f} n_{d,k+1;g,k}^2 r_{d,k+1;g,k} + \frac{1}{n_f^2}\left[n_{ca,1}^2(r_{ca,1}+r_{m1,1}) + \right.$$

$$\left. \sum_{k=2}^{n_f} n_{ca,k}^2(r_{ca,k}+r_{m1,k}) + n_{ca,n_f+1}^2(r_{ca,n_f+1}+r_{m1,n_f+1})\right],$$

$$R_{gate,tot} = r_{gate} + \frac{1}{n_f^2}\sum_{l=a,b,c,d} n_{pc,l}^2 r_{pc,l} + \frac{1}{n_f^2}\sum_{k=1}^{n_f} r_{g,k}. \quad (23)$$

Figure 9:
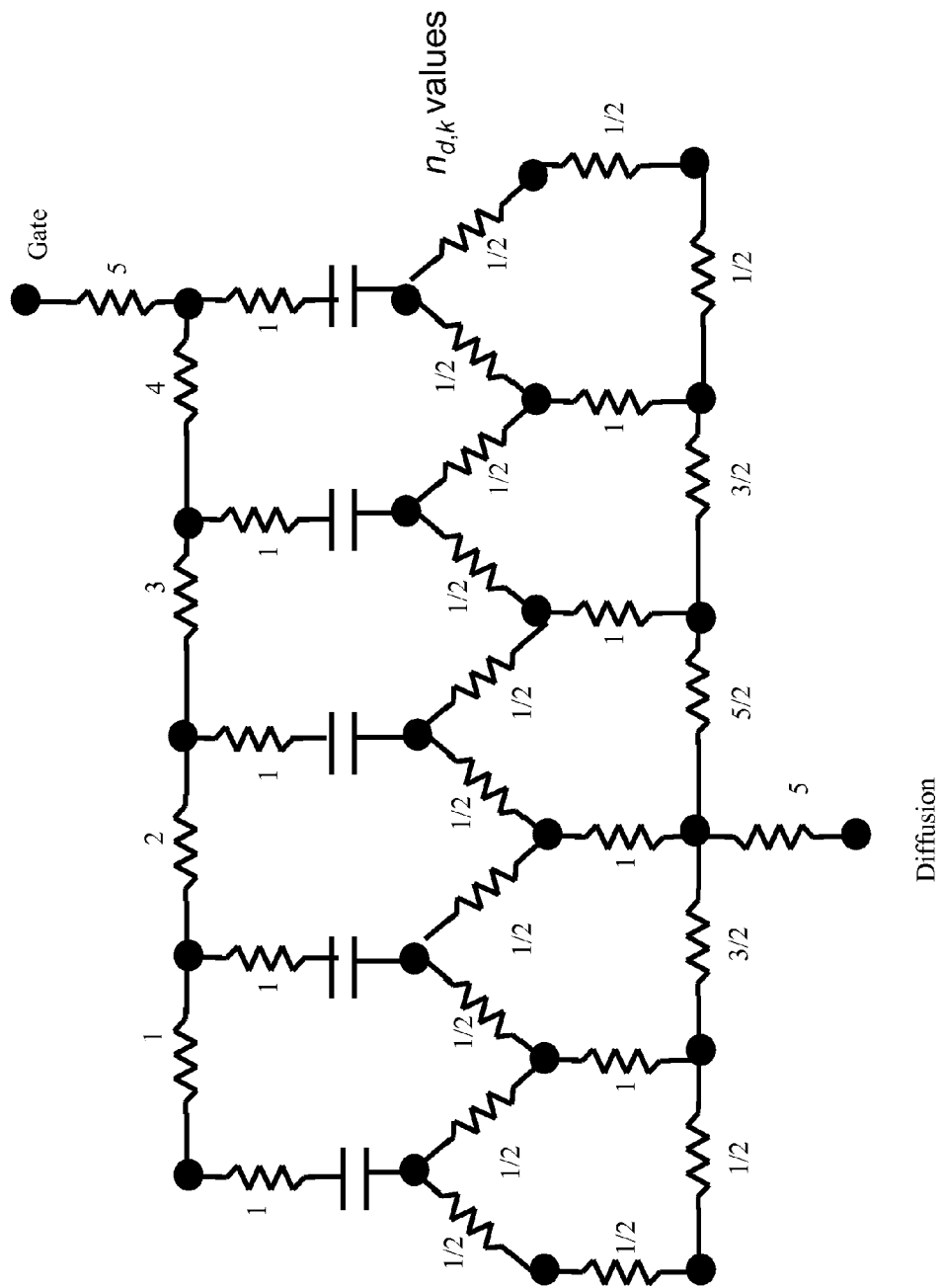
FIG. 9 shows the values of weighting factors $n_{d,k}$ and $n_{g,k}$ associated with each of the parasitic resistive elements in the netlist shown in FIG. 4.

The appropriate values of $n_{m1,a}$, $n_{m1,b}$, $n_{ca,1}$, etc. in equation (23) are listed in FIG. 9 for MOS capacitor 290. Insertion of those values into equation (23) yields below equation (24):

$$R_{diffusion,tot} = r_{diffusion,m1} + \quad (24)$$

$$\frac{1}{n_f^2}\left[\left(\frac{1}{2}\right)^2 r_{m1,a} + \left(\frac{3}{2}\right)^2 r_{m1,b} + \left(\frac{5}{2}\right)^2 r_{m1,c} + \left(\frac{3}{2}\right)^2 r_{m1,d} + \left(\frac{1}{2}\right)^2 r_{m1,e}\right] +$$

$$\frac{1}{2^2 n_f^2}\sum_{k=1}^{n_f} r_{d,k;g,k} + \frac{1}{2^2 n_f^2}\sum_{k=1}^{n_f} r_{d,k+1;g,k} + \frac{1}{n_f^2}\left[\left(\frac{1}{2}\right)^2(r_{ca,1}+r_{m1,1}) + \right.$$

$$\left. \sum_{k=2}^{n_f} 1^2(r_{ca,k}+r_{m1,k}) + \left(\frac{1}{2}\right)^2(r_{ca,n_f+1}+r_{m1,n_f+1})\right].$$

Typically, $r_{g1}$, $r_{g2}$, $r_{g3}$, etc. have the same value. In such a case, equation (23) may be simplified to below equation (25):

$$R_{gate,tot} = r_{gate} + \frac{1}{n_f^2}(1^2 r_{pc,a} + 2^2 r_{pc,b} + 3^2 r_{pc,c} + 4^2 r_{pc,d}) + \frac{1}{n_f}r_{g,1}. \quad (25)$$

Figure 12:
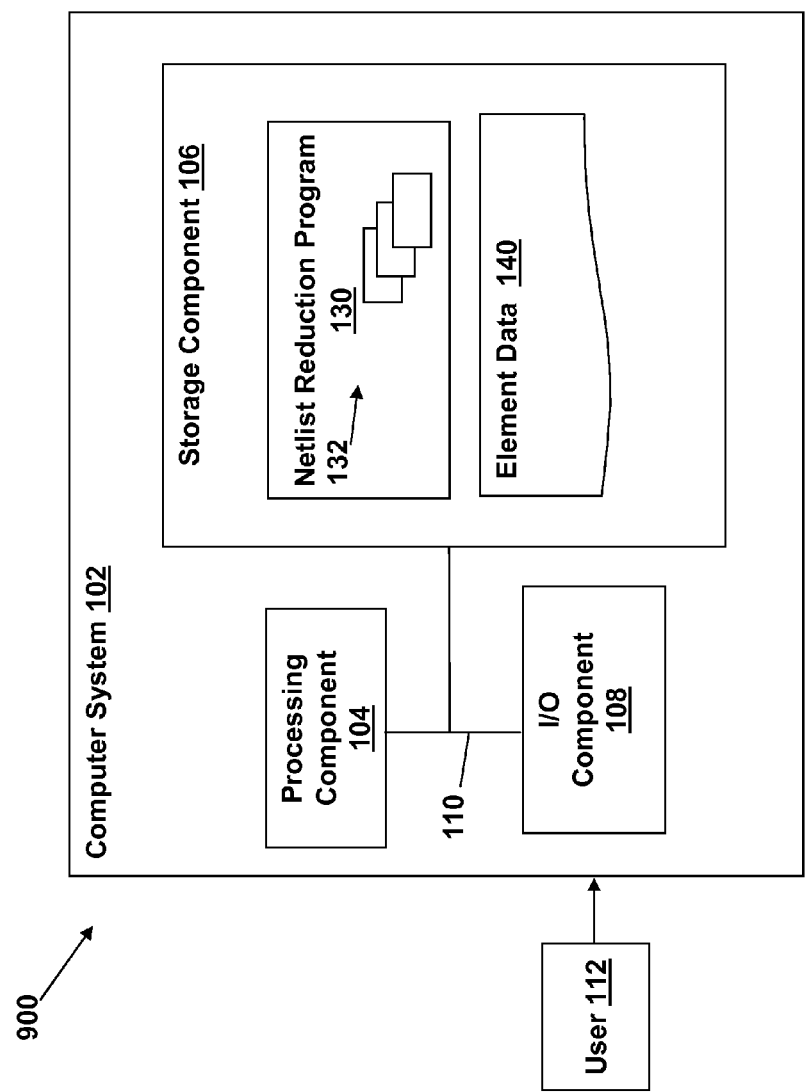
FIG. 12 shows an illustrative environment including a netlist reduction program according to an embodiment.

Turning to FIG. 12, an illustrative environment 900 for performing layout extraction for a multi-finger device, gate or circuit is shown according to an embodiment. To this extent, the environment 100 includes a computer system 102 that can perform a process described herein in order to perform a layout extraction for a multi-finger device. In particular, the computer system 102 is shown as including a netlist reduction program 130, which makes computer system 102 operable to reduce the netlist for a SPICE simulation by performing any/all of the processes described herein and implementing any/all of the embodiments described herein.

The computer system 102 is shown including a processing component 104 (e.g., one or more processors), a storage component 106 (e.g., a storage hierarchy), an input/output (I/O) component 108 (e.g., one or more I/O interfaces and/or devices), and a communications pathway 110. In general, the processing component 104 executes program code, such as the netlist reduction program 130, which is at least partially fixed in the storage component 106. While executing program code, the processing component 104 can process data (e.g, element data 140), which can result in reading and/or writing transformed data from/to the storage component 106 and/or the I/O component 108 for further processing. The pathway 110 provides a communications link between each of the components in the computer system 102. The I/O component 108 can comprise one or more human I/O devices, which enable a human user 112 to interact with the computer system 102 and/or one or more communications devices to enable a system user 112 to communicate with the computer system 102 using any type of communications link. To this extent, netlist reduction program 130 can manage a set of interfaces (e.g., graphical user interface(s), application program interface, etc.) that enable human and/or system users 112 to interact with the netlist reduction program 130. Further, the netlist reduction program 130 can manage (e.g., store, retrieve, create, manipulate, organize, present, etc.) data, such as total resistances of each node, element data 140 (e.g., values for: resistance, capacitance, inductance, etc.), etc., using any solution.

In any event, the computer system 102 can comprise one or more general purpose computing articles of manufacture (e.g., computing devices) capable of executing program code, such as the netlist reduction program 130, installed thereon. As used herein, it is understood that "program code" means any collection of instructions, in any language, code or notation, that cause a computing device having an information processing capability to perform a particular function either directly or after any combination of the following: (a) conversion to another language, code or notation; (b) reproduction in a different material form; and/or (c) decompression. To this extent, the 2-D constraint handling program 130 can be embodied as any combination of system software and/or application software.

Further, the netlist reduction program 130 can be implemented using a set of modules 132. In this case, a module 132 can enable the computer system 102 to perform a set of tasks used by the netlist reduction program 130, and can be separately developed and/or implemented apart from other portions of the netlist reduction program 130. As used herein, the term "component" means any configuration of hardware, with or without software, which implements the functionality described in conjunction therewith using any solution, while the term "module" means program code that enables the computer system 102 to implement the functionality described in conjunction therewith using any solution. When fixed in a storage component 106 of a computer system 102 that includes a processing component 104, a module is a substantial portion of a component that implements the functionality. Regardless, it is understood that two or more components, modules, and/or systems may share some/all of their respective hardware and/or software. Further, it is understood that some of the functionality discussed herein may not be implemented or additional functionality may be included as part of the computer system 102.

When the computer system 102 comprises multiple computing devices, each computing device may have only a portion of netlist reduction program 130 fixed thereon (e.g., one or more modules 132). However, it is understood that the computer system 102 and netlist reduction program 130 are only representative of various possible equivalent computer systems that may perform a process described herein. To this extent, in other embodiments, the functionality provided by the computer system 102 and netlist reduction program 130 can be at least partially implemented by one or more computing devices that include any combination of general and/or specific purpose hardware with or without program code. In each embodiment, the hardware and program code, if included, can be created using standard engineering and programming techniques, respectively.

Regardless, when the computer system 102 includes multiple computing devices, the computing devices can communicate over any type of communications link. Further, while performing a process described herein, the computer system 102 can communicate with one or more other computer systems using any type of communications link. In either case, the communications link can comprise any combination of various types of wired and/or wireless links; comprise any combination of one or more types of networks; and/or utilize any combination of various types of transmission techniques and protocols.

The computer system 102 can obtain or provide data, such as element data 140 using any solution. For example, the computer system 102 can generate and/or be used to generate element data 140, retrieve element data 140, from one or more data stores, receive element data 140, from another system, send element data 140 to another system, etc.

While shown and described herein as a method and system for performing layout extraction for a multi-finger device, gate or circuit, it is understood that aspects of the invention further provide various alternative embodiments. For example, in one embodiment, the invention provides a computer program fixed in at least one computer-readable medium, which when executed, enables a computer system to extract a layout for a multi-finger device, gate or circuit. To this extent, the computer-readable medium includes program code, such as the netlist reduction program 130 (FIG. 12), which implements some or all of the processes and/or embodiments described herein. It is understood that the term "computer-readable medium" comprises one or more of any type of tangible medium of expression, now known or later developed, from which a copy of the program code can be perceived, reproduced, or otherwise communicated by a computing device. For example, the computer-readable medium can comprise: one or more portable storage articles of manufacture; one or more memory/storage components of a computing device; paper; etc.

In another embodiment, the invention provides a method of providing a copy of program code, such as the netlist reduction program 130 (FIG. 12), which implements some or all of a process described herein. In this case, a computer system can process a copy of program code that implements some or all of a process described herein to generate and transmit, for reception at a second, distinct location, a set of data signals that has one or more of its characteristics set and/or changed in such a manner as to encode a copy of the program code in the set of data signals. Similarly, an embodiment of the invention provides a method of acquiring a copy of program code that implements some or all of a process described herein, which includes a computer system receiving the set of data signals described herein, and translating the set of data signals into a copy of the computer program fixed in at least one computer-readable medium. In either case, the set of data signals can be transmitted/received using any type of communications link.

In still another embodiment, the invention provides a method of generating a system for performing a layout extraction for a multi-finger device, gate or circuit. In this case, a computer system, such as the computer system 102 (FIG. 12), can be obtained (e.g., created, maintained, made available, etc.) and one or more components for performing a process described herein can be obtained (e.g., created, purchased, used, modified, etc.) and deployed to the computer system. To this extent, the deployment can comprise one or more of: (1) installing program code on a computing device; (2) adding one or more computing and/or I/O devices to the computer system; (3) incorporating and/or modifying the computer system to enable it to perform a process described herein; etc.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to an individual in the art are included within the scope of the invention as defined by the accompanying claims.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including Instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A computer-implemented method for performing a netlist reduction for a multi-finger device, the method comprising:

extracting a netlist for the multi-finger device,
　　wherein each finger in the multi-finger device has a width and the netlist includes a set of parasitic resistive elements, a set of parasitic inductive elements, and a set of parasitic capacitive elements;
　　identifying at least one of a common gate node for the multi-finger device, a common source node for the multi-finger device, a common drain node for the multi-finger device, a common diffusion node for the multi-finger device, and a common substrate node for the multi-finger device;
　　replacing all fingers of the multi-finger device with a new device having a total width equivalent to a sum of the widths of the fingers of the multi-finger device;
　　combining the set of parasitic resistive elements into a set of common resistive elements; and
　　producing a reduced netlist for the multi-finger device by placing the set of common resistive elements at a set of respective common nodes for the multi-finger device.

2. The computer implemented method of claim 1, wherein the combining of the set of parasitic resistive elements further includes:

combining parasitic resistive elements at the common source node into a common source resistive element;
　　combining parasitic resistive elements at the common drain node into a common drain resistive element;
　　combining parasitic resistive elements at the common gate node into a common gate resistive element;
　　combining parasitic resistive elements at the common substrate node into a common substrate resistive element;
　　producing a reduced netlist for the multi-finger device by placing each of the common source resistive element, the common drain resistive element, the common gate resistive element and the common substrate resistive element at a respective common node for the multi-finger device.

3. The computer-implemented method of claim 2, further comprising:

combining parasitic inductive elements at the common source node into a common source inductive element;
　　combining parasitic inductive elements at the common drain node into a common drain inductive element;
　　combining parasitic inductive elements at the common gate node into a common gate inductive element;
　　combining parasitic inductive elements at the common substrate node into a common substrate inductive element; and
　　producing a reduced netlist for the multi-finger device by placing each of the common source inductive element, the common drain inductive element, the common gate inductive element and the common substrate inductive element at a respective common node for the multi-finger device.

4. The computer-implemented method of claim 3, further comprising:
combining parasitic capacitive elements between the common source node and the common drain node into a representative source-drain capacitive element;
combining parasitic capacitive elements between the common gate node and the common source node into a representative gate-source capacitive element;
combining parasitic capacitive elements between the common gate node and the common drain node into a representative gate-drain capacitive element;
combining parasitic capacitive elements between the common source node and the common substrate node into a representative source-substrate capacitive element;
combining parasitic capacitive elements between the common drain node and the common substrate node into a representative drain-substrate capacitive element;
combining parasitic capacitive elements between the common gate node and the common substrate node into a representative gate-substrate capacitive element; and
producing a reduced netlist for the multi-finger device by placing each of the representative capacitive elements for a pair of common nodes between the respective pair of common nodes for the multi-finger device.

5. The computer implemented method of claim 4, wherein the combining of the parasitic capacitive elements further includes:
summing capacitance values of individual capacitive elements between a pair of common nodes to obtain a total capacitance value between the pair of common nodes; and
representing the summed capacitance values as a new capacitive element between the pair of common nodes.

6. The computer implemented method of claim 5, wherein the replacing of the multiple fingers of the device further includes:
connecting at least one node of the new device to a corresponding common node through at least a combined resistive element belonging to the corresponding common node or a combined inductive element belonging to the corresponding common node; and
connecting at least one pair of common nodes using a corresponding combined capacitive element.

7. The computer implemented method of claim 2, wherein the combining of the set of parasitic resistive elements further includes:
determining a total electric current passing through a common node;
determining an electric current passing through each resistive element associated with the common node;
determining a relative electric current passing through each of the resistive elements associated with the common node,
wherein the determining of the relative electric current passing through each of the resistive elements includes, dividing the electric current passing through a resistive element by the total electric current passing through the common node to determine a current ratio for the resistive element;
determining a resistance contribution of each of the resistive elements to the common node by multiplying the resistance of a resistive element by a square of the relative electric current passing through the resistive element; and summing the resistance contribution of each element associated with the common node.

8. The computer implemented method of claim 3, wherein the combining of the parasitic inductive elements further includes:
determining a total electric current passing through a common node;
determining an electric current passing through each of the inductive elements associated with the common node;
determining a relative electric current passing through each of the inductive elements associated with the common node,
wherein the determining the relative electric current passing through each of the inductive elements includes dividing the electric current passing through an inductive element by the total electric current passing through the common node to determine a current ratio for the inductive element;
determining an induction contribution of each of the inductive elements to a total inductance of the common node by multiplying the inductance of a inductive element by a square of the relative electric current passing through the inductive element; and
summing the inductance contribution of each element associated with the common node.

9. A computer system for performing a layout extraction for a multi-finger device, the computer system comprising:
at least one computing device configured to perform a netlist reduction for the multi-finger device by performing actions comprising:
extracting a netlist for the multi-finger device,
wherein each finger in the multi-finger device has a width and the netlist includes a set of parasitic resistive elements, a set of parasitic inductive elements, and a set of parasitic capacitive elements;
identifying at least one of a common gate node for the multi-finger device, a common source node for the multi-finger device, a common drain node for the multi-finger device, a common diffusion node for the multi-finger device, and a common substrate node for the multi-finger device;
replacing all fingers of the multi-finger device with a new device having a total width equivalent to a sum of the widths of the fingers of the multi-finger device;
combining the set of parasitic resistive elements into a set of common resistive elements; and
producing a reduced netlist for the multi-finger device by placing the set of common resistive elements at a set of respective common nodes for the multi-finger device.

10. The system of claim 9, wherein the combining of the set of parasitic resistive elements further includes:
combining parasitic resistive elements at the common source node into a common source resistive element;
combining parasitic resistive elements at the common drain node into a common drain resistive element;
combining parasitic resistive elements at the common gate node into a common gate resistive element;
combining parasitic resistive elements at the common substrate node into a common substrate resistive element;
producing a reduced netlist for the multi-finger device by placing each of the common source resistive element, the common drain resistive element, the common gate resistive element and the common substrate resistive element at a respective common node for the multi-finger device.

11. The system of claim 10, wherein the replacing of the multiple fingers of the device further includes:
   combining parasitic inductive elements at the common source node into a common source inductive element;
   combining parasitic inductive elements at the common drain node into a common drain inductive element;
   combining parasitic inductive elements at the common gate node into a common gate inductive element;
   combining parasitic inductive elements at the common substrate node into a common substrate inductive element; and
   producing a reduced netlist for the multi-finger device by placing each of the common source inductive element, the common drain inductive element, the common gate inductive element and the common substrate inductive element at a respective common node for the multi-finger device.

12. The system of claim 11, wherein the replacing of the multiple fingers of the device further includes:
   combining parasitic capacitive elements between the common source node and the common drain node into a representative source-drain capacitive element;
   combining parasitic capacitive elements between the common gate node and the common source node into a representative gate-source capacitive element;
   combining parasitic capacitive elements between the common gate node and the common drain node into a representative gate-drain capacitive element;
   combining parasitic capacitive elements between the common source node and the common substrate node into a representative source-substrate capacitive element;
   combining parasitic capacitive elements between the common drain node and the common substrate node into a representative drain-substrate capacitive element;
   combining parasitic capacitive elements between the common gate node and the common substrate node into a representative gate-substrate capacitive element; and
   producing a reduced netlist for the multi-finger device by placing each of the representative capacitive elements for a pair of common nodes between the respective pair of common nodes for the multi-finger device.

13. The system of claim 10, wherein the combining of the parasitic resistive elements further includes:
   determining a total electric current passing through a common node;
   determining an electric current passing through each resistive element associated with the common node;
   determining a relative electric current passing through each of the resistive elements associated with the common node,
   wherein the determining of the relative electric current passing through each of the resistive elements includes, dividing the electric current passing through a resistive element by the total electric current passing through the common node to determine a current ratio for the resistive element;
   determining a resistance contribution of each of the resistive elements to the common node by multiplying the resistance of a resistive element by a square of the relative electric current passing through the resistive element; and
   summing the resistance contribution of each element associated with the common node.

14. The system of claim 11, wherein the combining of the parasitic inductive elements further includes:
   determining a total electric current passing through a common node;
   determining an electric current passing through each of the inductive elements associated with the common node;
   determining a relative electric current passing through each of the inductive elements associated with the common node,
   wherein the determining the relative electric current passing through each of the inductive elements includes dividing the electric current passing through an inductive element by the total electric current passing through the common node to determine a current ratio for the inductive element;
   determining an induction contribution of each of the inductive elements to a total inductance of the common node by multiplying the inductance of a inductive element by a square of the relative electric current passing through the inductive element; and
   summing the inductance contribution of each element associated with the common node.

15. The system of claim 14, wherein the combining of the parasitic capacitive elements further includes:
   summing capacitance values of individual capacitive elements between a pair of common nodes to obtain a total capacitance value between the pair of common nodes; and
   representing the summed capacitance values as a new capacitive element between the pair of common nodes.

16. The system of claim 15, wherein the replacing of the multiple fingers of the device further includes:
   connecting at least one node of the new device to a corresponding common node through at least a combined resistive element belonging to the corresponding common node or a combined inductive element belonging to the corresponding common node; and
   connecting at least one pair of common nodes using a corresponding combined capacitive element.

17. A computer-readable storage medium embodying program code, which when executed, enables a computer system to implement a method for performing a netlist reduction for a multi-finger device, the method comprising:
   extracting a netlist for the multi-finger device,
   wherein each finger in the multi-finger device has a width and the netlist includes a set of parasitic resistive elements, a set of parasitic inductive elements, and a set of parasitic capacitive elements;
   identifying at least one of a common gate node for the multi-finger device, a common source node for the multi-finger device, a common drain node for the multi-finger device, a common diffusion node for the multi-finger device, and a common substrate node for the multi-finger device;
   replacing all fingers of the multi-finger device with a new device having a total width equivalent to a sum of the widths of the fingers of the multi-finger device;
   combining parasitic resistive elements at the common source node into a common source resistive element;
   combining parasitic resistive elements at the common drain node into a common drain resistive element;
   combining parasitic resistive elements at the common gate node into a common gate resistive element;
   combining parasitic resistive elements at the common substrate node into a common substrate resistive element; and
   producing a reduced netlist for the multi-finger device by placing each of the common source resistive element, the common drain resistive element, the common gate resistive element and the common substrate resistive element at a respective common node for the multi-finger device.

18. The computer-readable storage medium of claim 17, the method further comprising:
   combining parasitic capacitive elements between the common source node and the common drain node into a representative source-drain capacitive element;
   combining parasitic capacitive elements between the common gate node and the common source node into a representative gate-source capacitive element;
   combining parasitic capacitive elements between the common gate node and the common drain node into a representative gate-drain capacitive element;
   combining parasitic capacitive elements between the common source node and the common substrate node into a representative source-substrate capacitive element;
   combining parasitic capacitive elements between the common drain node and the common substrate node into a representative drain-substrate capacitive element;
   combining parasitic capacitive elements between the common gate node and the common substrate node into a representative gate-substrate capacitive element; and
   producing a reduced netlist for the multi-finger device by placing each of the representative capacitive elements for a pair of common nodes between the respective pair of common nodes for the multi-finger device.

19. The computer-readable storage medium of claim 17, wherein the combining parasitic resistive elements further includes:
   determining a total electric current passing through a common node;
   determining an electric current passing through each resistive element associated with the common node;
   determining a relative electric current passing through each of the resistive elements associated with the common node,
   wherein the determining of the relative electric current passing through each of the resistive elements includes, dividing the electric current passing through a resistive element by the total electric current passing through the common node to determine a current ratio for the resistive element;
   determining a resistance contribution of each of the resistive elements to the common node by multiplying the resistance of a resistive element by a square of the relative electric current passing through the resistive element; and
   summing the resistance contribution of each element associated with the common node.

20. The computer-readable storage medium of claim 19, wherein the combining parasitic capacitive elements further includes:
   summing capacitance values of individual capacitive elements between a pair of common nodes to obtain a total capacitance value between the pair of common nodes; and
   representing the summed capacitance values as a new capacitive element between the pair of common nodes.

\* \* \* \* \*